(12) United States Patent
Eichler-Neumann et al.

(10) Patent No.: US 10,025,049 B2
(45) Date of Patent: Jul. 17, 2018

(54) OPTOELECTRICAL CONNECTOR MODULE

(71) Applicant: FCI USA LLC, Etters, PA (US)

(72) Inventors: Alexander Eichler-Neumann, Berlin (DE); Michael Richter, Besancon (FR)

(73) Assignee: FCI USA LLC, Etters, PA (US)

( * ) Notice: Subject to any disclaimer, the term of this patent is extended or adjusted under 35 U.S.C. 154(b) by 0 days.

(21) Appl. No.: 15/328,472

(22) PCT Filed: Jul. 22, 2015

(86) PCT No.: PCT/US2015/041466
§ 371 (c)(1),
(2) Date: Jan. 23, 2017

(87) PCT Pub. No.: WO2016/014622
PCT Pub. Date: Jan. 28, 2016

(65) Prior Publication Data
US 2017/0212317 A1    Jul. 27, 2017

Related U.S. Application Data

(60) Provisional application No. 62/028,093, filed on Jul. 23, 2014.

(51) Int. Cl.
*G02B 6/42* (2006.01)
*H05K 1/14* (2006.01)
*H05K 3/00* (2006.01)

(52) U.S. Cl.
CPC ......... *G02B 6/4281* (2013.01); *G02B 6/4206* (2013.01); *G02B 6/428* (2013.01);
(Continued)

(58) Field of Classification Search
None
See application file for complete search history.

(56) References Cited

U.S. PATENT DOCUMENTS 3,766,439 A * 10/1973 Isaacson ............... H05K 1/189
174/252
6,767,142 B2 * 7/2004 Stricot ................ G02B 6/4201
385/88

(Continued)

OTHER PUBLICATIONS

International Search Report and Written Opinion for International Application No. PCT/US2015/041466 dated Oct. 23, 2015.
(Continued)

*Primary Examiner* — Mike Stahl
(74) *Attorney, Agent, or Firm* — Wolf, Greenfield & Sacks, P.C.

(57) ABSTRACT

The present disclosure relates to an optoelectrical connector module comprising a flexible circuit board (10) having a first region and a second region and a printed circuit board (PCB) (20) that is attached to the first region of the flexible circuit board, and an optical module (30) that is attached to the second region of the flexible circuit board. The optical module is configured to transmit and/or receive light signals. The optoelectrical connector module comprises further a rigid support structure (40) having a first and a second surface that enclose a defined angle. The first surface of the rigid support structure is thereby arranged in parallel to the PCB and the second surface of the rigid support structure is connected to the flexible circuit board opposite the second region.

23 Claims, 3 Drawing Sheets

(52) U.S. Cl.
CPC ......... *G02B 6/4245* (2013.01); *G02B 6/4257* (2013.01); *G02B 6/4269* (2013.01); *G02B 6/4292* (2013.01); *H05K 1/147* (2013.01); *G02B 6/4246* (2013.01); *H05K 3/0061* (2013.01); *H05K 2201/046* (2013.01); *H05K 2201/056* (2013.01); *H05K 2201/10121* (2013.01)

(56) References Cited

U.S. PATENT DOCUMENTS

| | | | | |
|---|---|---|---|---|
| 7,070,341 | B2* | 7/2006 | Rathnam | G02B 6/4201 385/53 |
| 7,290,944 | B2* | 11/2007 | Ishigami | G02B 6/4201 385/88 |
| 2003/0053762 | A1* | 3/2003 | Cheng | G02B 6/4201 385/88 |
| 2004/0028350 | A1* | 2/2004 | Gerdom | G02B 6/4204 385/88 |
| 2005/0220427 | A1* | 10/2005 | Therisod | G02B 6/4201 385/92 |
| 2005/0276547 | A1 | 12/2005 | Wang et al. | |
| 2006/0008214 | A1 | 1/2006 | Giboney et al. | |
| 2011/0058818 | A1* | 3/2011 | Karnopp | G02B 6/4201 398/135 |
| 2012/0207427 | A1 | 8/2012 | Ito | |
| 2013/0315528 | A1 | 11/2013 | Levy | |
| 2014/0104792 | A1* | 4/2014 | Jeziorek | H05K 3/0061 361/749 |

OTHER PUBLICATIONS

International Preliminary Report on Patentability for International Application No. PCT/US2015/041466 dated Feb. 2, 2017.

* cited by examiner

OPTOELECTRICAL CONNECTOR MODULE

RELATED APPLICATIONS

This application is the U.S. National Stage of and claims priority to International Patent Application Number PCT/US2015/041466, filed Jul. 22, 2015, entitled "OPTOELECTRICAL CONNECTOR MODULE," which claims priority to and the benefit of U.S. Provisional Patent Application No. 62/028,093, filed Jul. 23, 2014, entitled "OPTOELECTRICAL CONNECTOR MODULE," each of which is hereby incorporated herein by reference in their entireties.

FIELD OF THE DISCLOSURE

The present disclosure relates to an optoelectrical connector module, allowing to connect an optical signal line to a printed circuit board (PCB) in an angle different from 0° and 90°.

BACKGROUND

In many electronic applications it is necessary to connect optical signal lines to printed circuit boards (PCB). To this end, it is necessary to provide optical modules that are arranged on the PCB. These optical modules further comprise in general a suitable optical connector, respectively interface, to transfer light signals from a fiber cable to the photonic device or vice-versa. Optical modules are for example receivers, transmitters, transceivers and transponders for data- and telecommunication applications configured to send optical signals derived from electrical signals and/or receive optical signals which are transformed into electrical signals.

Optical modules known in the art, such as Finisar® BOA (Board-Mount Optical Assembly) are mounted on a PCB and receive or transmit light perpendicular to the plane of the PCB. However, a major problem in this context is high space consumption due to optical cable guiding, since the connection angle in this case (perpendicular to the plane of the PCB) is 90°. The connection angle is thereby defined as the angle enclosed by the received/transmitted light and the plane of the PCB.

A system that receives or transmits light parallel to the plane of the PCB (connection angle: 0° respectively 180°) is known from U.S. Pat. No. 6,867,377 B2, wherein a flexible printed circuit board is used in connection with an optical transmitter module. The optical transmitter is attached on the flexible printed circuit board in a first region of the flexible printed circuit board. In a second region, the flexible circuit board is soldered to a PCB. For emitting light signals in a plane parallel to the PCB, an ashlar-formed element is placed on the second region of the flexible circuit board and the first region is bent upward and attached to the ashlar formed element. However, these systems are inappropriate to design optoelectrical connector arrays on a single PCB, since the first row of connectors would block the second row of connectors from being connected.

From WO 2012/097979 A1 optical modules are known that receive or transmit light under a defined angle relative to the plane of the PCB, so that multiple connectors can be arranged in an array on one PCB. To this end, an optical coupler having a first and a second light coupling port is used to bend the beam path of the emitted and/or received light signal. This optical coupler is connected to a known optical module, which is placed on a PCB. A light guiding member inside the optical coupler, which connects the first and second light coupling port, redirects the light so that it passes the optical coupler under a desired angle. However, due to said redirection of the light signal significant bending losses occur as well as coupling losses, since at least two optical connectors are necessary.

It is therefore one object to provide an optoelectrical connector module that offers an improved way of connecting a known connector (such as a MT ferrule) in a defined angle different from 0° and 90° (i.e. between 0° and 90°, like e.g. 30°) relative to the plane of a PCB to an optical module to allow a great number of optoelectrical connector systems to be used in parallel or in form of connector arrays, while keeping a compact design of low height. Preferably, the optoelectrical connector module can be manufactured simple and cost efficient and should most preferably reduce bending and coupling losses of the light signal. Still further, the optoelectrical connector module should provide an improved cooling mechanism. These and other objects which will become apparent upon reading the following description are solved by an optoelectrical connector module according to claim 1.

SUMMARY

According to one embodiment, an optoelectrical connector module is suggested, which comprises a flexible circuit board that has at least a first and a second region. The flexible circuit board can for example be made of a flexible plastic substrate, such as polyimide, PEEK, PET or a transparent conductive polyester film, allowing the board to conform to a desired shape.

The flexible circuit board can be a single or multi-layer flexible circuit board providing one or more electrically conductive layers. To provide a high flexibility and small bending radius, the flexible printed circuit board is preferably thinner than 1 mm, more preferably 0.5 mm and most preferably thinner than 0.2 mm. The bending radius of the flexible circuit board should be less than 3 mm, preferably less than 1.5 mm and most preferably less than 0.5 mm.

The first and second regions of the flexible circuit board define two separate areas on the surface of the flexible circuit board. They can be either on the same side or on opposite sides of the flexible circuit board but may not be in parallel planes. The first and second regions are separated by a bending area.

The optoelectrical connector module comprises further a standard printed circuit board (PCB), i.e. that is not a flexible circuit board, but rigid in order to mechanically support and electrically connect electronic components of the optoelectrical connector module. Generally preferred, the PCB has a thickness of more than 2 mm, more preferably more than 3 mm. The PCB is attached to the first region of the flexible circuit board by a suitable electrical and/or mechanical connection technique, such as soldering, bonding and/or (conductive) gluing.

The optoelectrical connector module comprises further an optical module (30) that transmits light signals derived from electrical signals and/or receives light signals which are transformed into electrical signals.

The optical module is attached to the second region of the flexible circuit board by a suitable electrical and/or mechanical connection technique, such as soldering, bonding and/or (conductive) gluing. Said second region can either be on the same or the opposite side as the first region of the flexible circuit board, to which the PCB is attached to, but it is in any case not in a parallel plane.

The light is received and/or transmitted by the optical module in a direction perpendicular or parallel to said second region of the flexible circuit board, so that undesired bending losses are significantly reduced.

In order to conform the flexible circuit board to a desired shape, the optoelectrical connector module further comprises a rigid support structure having at least a first and a second surface. The rigid support structure is designed to withstand the connection forces that occur during the plugging of the optoelectrical connector without any significant deformation. Therefore, the rigid support structure is preferably made of a ceramic, a suitable thermoplastic material such as PEEK, Polyamide or Polyimide or more preferably of a metallic material such as aluminum, copper or alloys or a combination thereof.

The rigid support structure has at least two plane surfaces that enclose an angle that is different from 0° and or 90°. In other words, the first and second surfaces of the rigid support structure are neither in the same plane, nor parallel to each other (angle is different from 0°), nor are they perpendicular to each other (angle is different from 90°).

The first surface of the rigid support structure is arranged parallel to the plane of the printed circuit board (PCB). The first surface can be attached directly or indirectly to the PCB. Further it is also possible to arrange the first surface of the rigid support structure adjacent to the PCB on a mounting structure such as a housing of the optoelectrical connector module, or partly on the PCB.

The attachment of the first surface of the rigid support structure can be done by a purely mechanical connection technique such as gluing, screwing, snap joints or any other suitable connection technique, or an electro mechanical connection technique such as soldering. Combinations of connection techniques are also possible.

The second surface of the rigid support structure is connected to the flexible circuit board opposite the second region of the flexible circuit board. In other words, the optical module and the second surface of the rigid support structure are positioned opposite each other and are connected and attached to opposite sides of the flexible circuit board.

The connection of the second surface of the rigid support structure to the flexible circuit board can be done by a purely mechanical connection technique such as gluing, screwing, snap joints or any other suitable connection technique, or by an electro mechanical connection technique such as soldering. Combinations of connection techniques are also possible.

The attachment of the PCB and the optical module to the flexible circuit board on the one hand, and the connection of the flexible circuit board to the rigid support structure on the other hand, conform the optoelectrical connector module to the desired angle that is different from 0° and 90°.

Therefore light signals can be received and/or transmitted under an angle different from 0° and or 90° relative to the plane of the PCB, without an undesired redirection of the light signal. Advantageously additional bending and coupling losses can be avoided. Further, space consumption of the optical cables and connector arrays can be reduced on a single PCB due to variable connection angles.

BRIEF DESCRIPTION OF THE DRAWINGS

In the following, reference is made to the following figures, in which.

DETAILED DESCRIPTION

Figure 1:
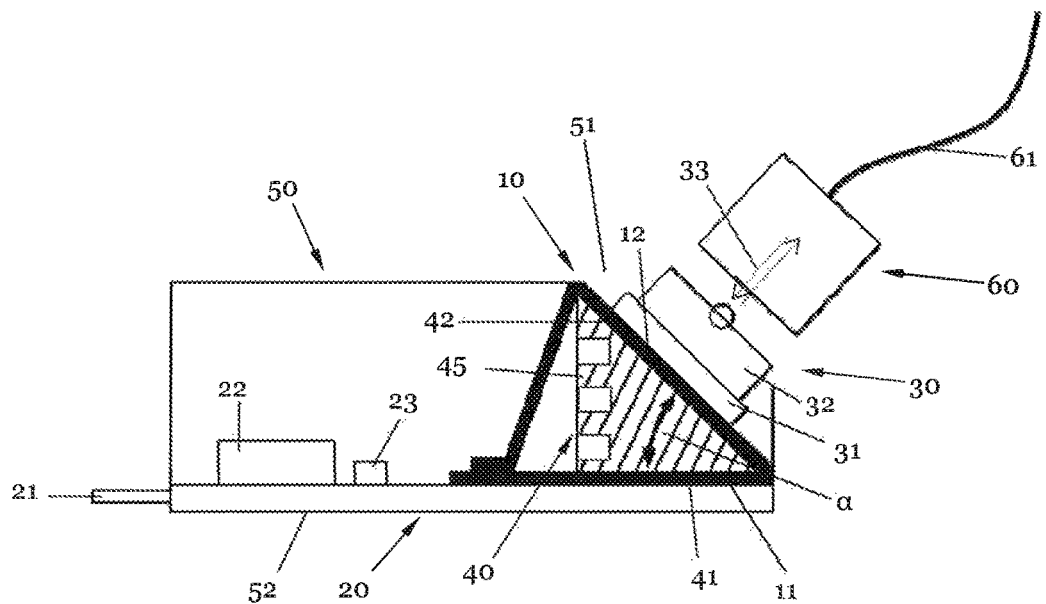
FIG. 1 is a schematic view of an optoelectrical connector module in accordance with a first embodiment.

FIG. 1 shows a schematic view of an optoelectrical connector module, comprising a flexible circuit board 10, a PCB 20, an optical module 30 and a rigid support structure 40. The PCB 20 is attached to a first region 11 of the flexible circuit board 10 and the optical module 30 is attached to a second region 12 of the flexible circuit board 10.

The first surface 41 of the rigid support structure 40 is parallel to the plane of the PCB 20. The second surface 42 of the rigid support structure 40 is connected to the flexible circuit board opposite the second region 12 of the flexible circuit board 10. As one can see, the first and second surfaces of the rigid support structure 40 enclose an angle $\alpha$ that is different from 0° and 90°, namely approximately 50°. Generally preferred, the angle $\alpha$ is between 5° and 85°, more preferably between 5° and 70°, still more preferably between 8° and 60° and even most preferably between 10° and 40°. As the skilled person will understand, the choice of this angle depends on the orientation of the optical module (this will be explained in more detail below under reference to FIG. 4). The aim is that the direction of light received or transmitted by the optical module relative to the plane of the PCB is at an angle of between 5° and 85°, more preferably between 5° and 70°, still more preferably between 8° and 60° and even most preferably between 10° and 40°. Such a configuration allows a very compact design with a low height.

The optical module 30 can comprise a transmitting and/or receiving part 31 that transforms electrical signals, received from the flexible circuit board 10 to light signals 33 and vice versa. The light signals 33 are then guided by an optical port 32 and a connector 60 to the optical wave guide 61. The optical port 32 may comprise lenses for light guiding or other suitable light guide, but does preferably not bend the light beam.

In an advantageous embodiment, the PCB 20 has electrical contacts 21 that are capable of connecting the PCB 20 to an external environment. The external environment can be a further PCB, a plug in board or a control cabinet or any other electrical circuit. Via the electrical contacts 21, the PCB 20 can be electrically connected by plugging, soldering, bonding and/or conductive gluing or any other suitable technique. The electrical contacts 21 can be either orientated parallel to the plane of the PCB, or perpendicular thereto (cf. e.g. FIG. 3).

In a further embodiment, the PCB 20 can be equipped with additional electrical components such at least one microcontroller 22 and/or at least one sensor 23. Further, it is also possible to provide the flexible circuit board 10 with electrical components such at least microcontrollers and/or sensors (not shown). The sensor 23 can be a temperature sensor (e.g. NTC) or the like.

In a further embodiment, the support structure 40 is a metallic heat sink. The heat sink may be provided with cooling fins 45 to optimize the cooling performance. Heat is generated in the optical module 30 and therefore, the heat sink 40 is thermally coupled to the optical module 30. In a preferred embodiment, the flexible circuit board provides orifices in the area of the second region 12 to enable a direct contact of the heat sink 40 and the optical module 30.

In another embodiment, the thermal coupling is achieved through the flexible circuit board 10. Thermal coupling can be improved by the use of heat transfer paste, thermal conducting glue or the like.

In a preferred embodiment, the optoelectrical connector module comprises a corresponding counter connector 60 that comprises at least one optical wave guide 61. The counter connector 60 is preferably a mechanical transfer ferrule (MT ferrule).

Figure 2:
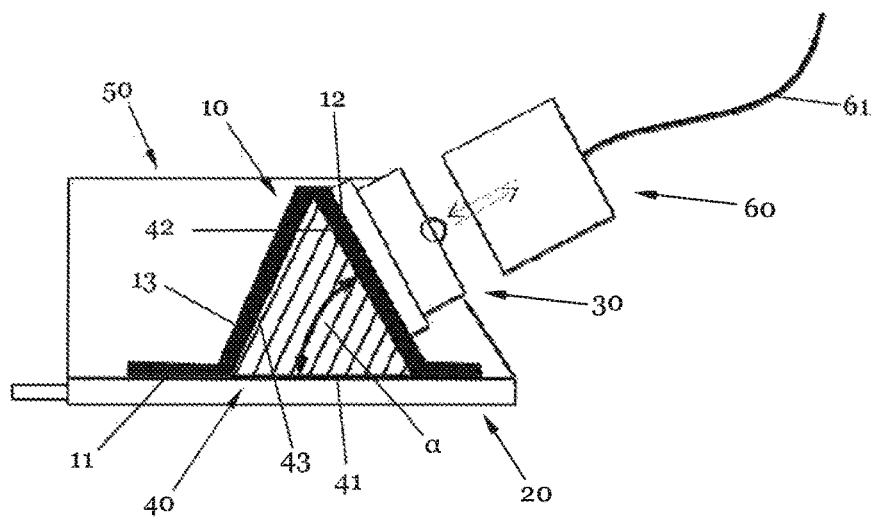
FIG. 2 is a schematic view of an optoelectrical connector module in accordance with a second embodiment.

FIG. 2 shows a schematic view of a further embodiment of an optoelectrical connector module, comprising also a flexible circuit board 10, a PCB 20, an optical module 30 and a rigid support structure 40. The embodiment of FIG. 2 (and FIGS. 3, 4 and 5) employs essentially the same parts with a different geometric configuration, so that in the following the same reference numbers are used to denote similar or essentially identical elements.

The PCB 20 of FIG. 2 is attached to the first region 11 of the flexible circuit board 10 and the optical module 30 is attached to the second region 12 of the flexible circuit board 10. The first surface 41 of the rigid support structure 40 is attached directly to the PCB 20 and is parallel to the plane of the PCB. The second surface 42 of the rigid support structure 40 is connected to the flexible circuit board opposite the second region 12 of the flexible circuit board 10 and is arranged at an angle of approximately 60° to the first surface 41 (and thus also to the plane of the PCB 20). In the embodiment of FIG. 2, the flexible circuit board has a third region 13 that is attached to a third surface 43 of the rigid support structure 40, allowing an improved thermal coupling. Further, the mechanical strength can be increased by attaching the flexible circuit board to more than one surface of the rigid support structure. To further improve the mechanical strength of the attachment of the flexible circuit board 10 to the PCB 20, the flexible circuit board 10 can be additionally attached at a region different from the first region to the PCB 20.

Figure 3:
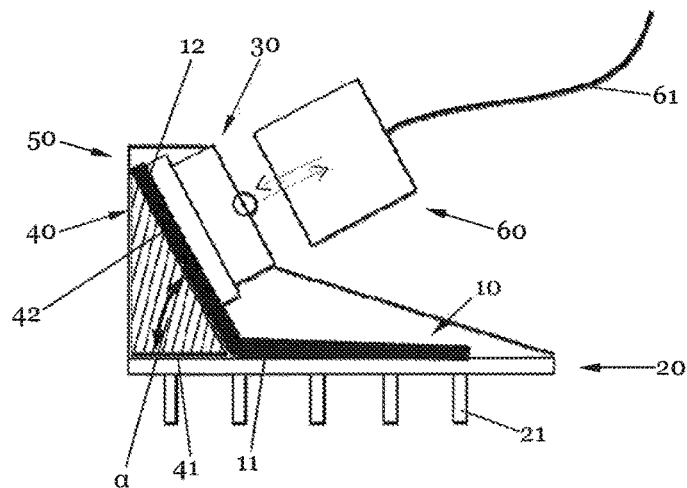
FIG. 3 is a schematic view of an optoelectrical connector module in accordance with a third embodiment.

FIG. 3 shows a schematic view of a further embodiment of an optoelectrical connector module, comprising a flexible circuit hoard 10, a PCB 20, an optical module 30 and a rigid support structure 40. To improve the heat transfer capabilities of the rigid support structure 40, the rigid support structure 40 can be thermally coupled to a housing 50 of the optoelectrical connector module. A thermal coupling is achieved by mechanically attaching the rigid support structure 40 to the housing 50 by gluing, soldering, screwing, snap joints or any other suitable technique. Thermal coupling can be improved by the use of heat transfer paste, thermal conducting glue or the like.

Figure 4:
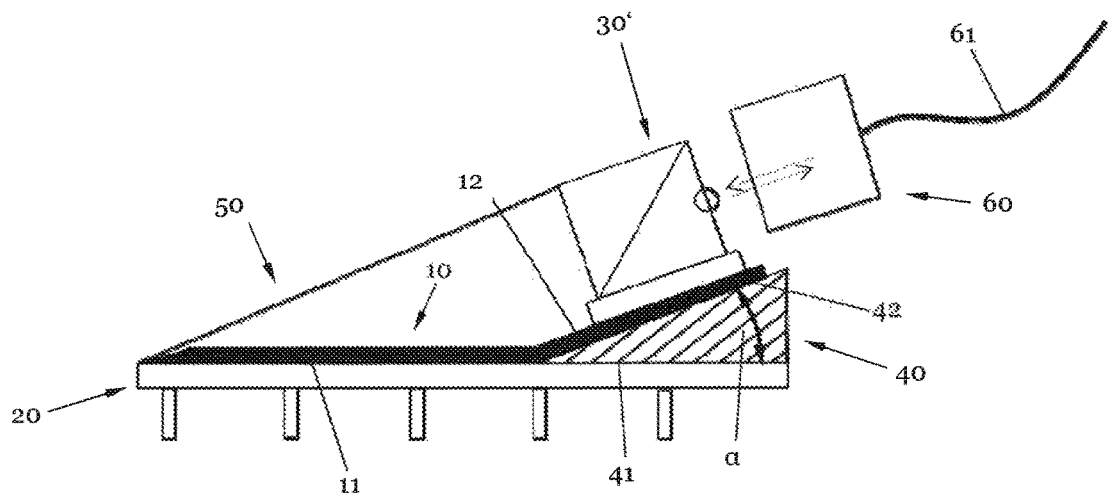
FIG. 4 is a schematic view of an optoelectrical connector module in accordance with a fourth embodiment.

FIG. 4 shows a schematic view of a further embodiment an optoelectrical connector module, comprising, a flexible circuit board 10, a PCB 20, an optical module 30' and a rigid support structure 40. The difference between the module 30' and the modules 30 is in particular the orientation in which the counter connector 60 is coupled to the module and thus the direction of light emitted or received by the module relative to the plane of the PCB. The construction of FIG. 4 has a relatively small angle α of approximately 25° and the angle of the direction of light relative to the plane of the PCB is identical. Generally preferred, irrespective whether the optical module receives and/or transmits light in a direction perpendicular (like in FIG. 1) or parallel to (like in FIG. 4) the second surface of the support structure, the first and second surfaces of the support structure should enclose an angle α such that the direction of light transmitted and/or received by the optical module relative to the plane of the PCB is between 5° and 85°, more preferably between 5° and 70°, still more preferably between 8° and 60° and even most preferably between 10° and 40°. To improve the heat transfer capabilities of the rigid support structure 40, the rigid support structure 40 is part of the housing 50. Therefore, the heat conducted in the rigid support structure can be directly dissipated to the environment.

Figure 5:
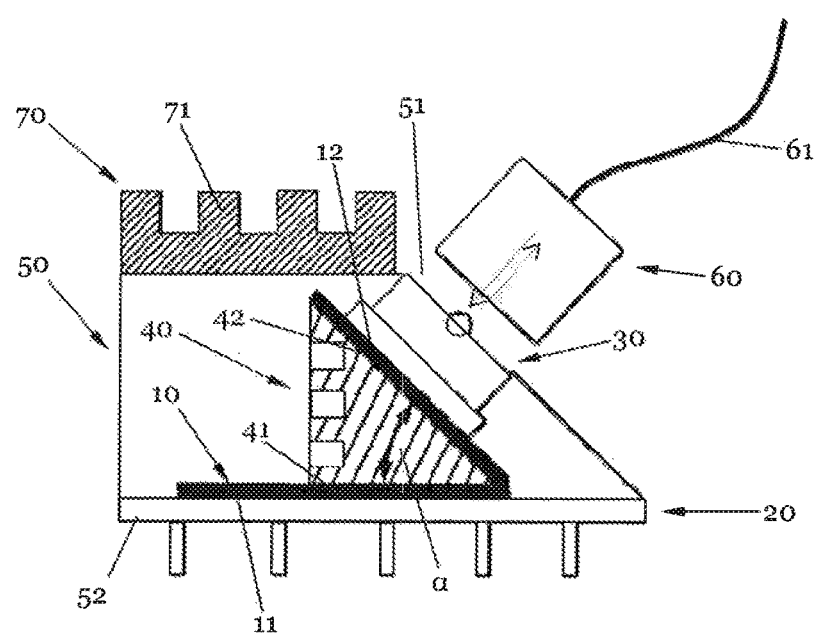
FIG. 5 is a schematic view of an optoelectrical connector module in accordance with a fifth embodiment.

FIG. 5 shows a schematic view of a further embodiment an optoelectrical connector module, comprising, a flexible circuit board 10, a PCB 20, an optical module 30 and a rigid support structure 40. The flexible circuit board 10 and the rigid support structure 40 are covered entirely by a housing 50. The housing further has an orifice 51 that enables the light signals from/to the optical module 30 to exit/enter the optoelectrical connector module. The orifice 51 receives the connector 60 of the connector system at least partly. The PCB 20 is at least partly covered by the housing. In the shown embodiment, a lower wall of the housing is formed by the PCB 20.

In a preferred embodiment, the optoelectrical connector module further comprises an additional heat sink 70. The heat sink 70 can have surface structures, such as cooling fins 71 to improve the cooling performance. The heat sink 70 is attached to an outer surface of the housing 50 by glue, solder, screw, snap joints or any other suitable attachment mechanism. Thermal coupling can be improved by the use of heat transfer paste, thermal conducting glue or the like.

In a still further embodiment, the heat sink 70 can be integrally formed with the housing 50 or be at least one part of the housing 50.

The embodiments described herein have been presented by way of illustration, and the present invention is therefore not intended to be limited to the disclosed embodiments. Furthermore, the structure and features of each the embodiments described above can be applied to the other embodiments described herein, unless otherwise indicated. Accordingly, those skilled in the art will realize that the invention is intended to encompass all modifications and alternative arrangements included within the spirit and scope of the invention, for instance as set forth by the appended claims.

What is claimed:

1. An optoelectrical connector module, comprising:
   a flexible circuit board having a first region and a second region,
   a printed circuit board (PCB) that is attached to the first region of the flexible circuit board,
   a photoelectric device that transforms electrical signals to light signals and/or transforms light signals into electrical signals, wherein the photoelectric device is attached to the second region of the flexible circuit board and
   a rigid support structure having a first and a second surface, wherein the first surface is arranged parallel to the plane of the printed circuit board (PCB) and the second surface is connected to the flexible circuit board opposite the second region of the flexible circuit board, wherein the first and second surfaces of the rigid support structure enclose an angle that is between 5° and 85°.

2. The optoelectrical connector module of claim 1, wherein the angle is between 8° and 60°.

3. The optoelectrical connector module of claim 1, wherein the photoelectric device is configured to receive and/or transmit light in a direction perpendicular or parallel to the second surface of the support structure.

4. The optoelectrical connector module of claim 1 wherein the photoelectric device comprises:
   at least an optical transmitting and/or receiving part, wherein each of the transmitting and/or receiving part contains electrical and/or optical parts, and
   an optical port, wherein the optical port comprises optical lenses.

5. The optoelectrical connector module of claim 1, wherein the support structure is a metallic heat sink, providing a thermal coupling to the photoelectric device.

6. The optoelectrical connector module of claim 1, wherein the optoelectrical connector module further comprises a housing and wherein the support structure is thermally coupled to the housing.

7. The optoelectrical connector module of claim 1, wherein the PCB comprises further electrical contacts that are capable of connecting the PCB to an external environment.

8. An optoelectrical connector module of claim 1, comprising:
   a flexible circuit board having a first region and a second region,
   a printed circuit board (PCB) that is attached to the first region of the flexible circuit board,
   an optical module that is attached to the second region of the flexible circuit board, and
   a rigid support structure having a first and a second surface, wherein the first surface is arranged parallel to the plane of the printed circuit board (PCB) and the second surface is connected to the flexible circuit board opposite the second region of the flexible circuit board, wherein the first and second surfaces of the rigid support structure enclose an angle that is different from 0° and 90°,
   wherein the PCB further comprises at least one micro controller or at least one sensor.

9. The optoelectrical connector module of claim 1, wherein the optoelectrical connector module is adapted to receive an optical counter connector.

10. The optoelectrical connector module of claim 1, wherein the optoelectrical connector module further comprises an additional heat sink besides the rigid support structure.

11. The optoelectrical connector module according to claim 10, wherein the optoelectrical connector module further comprises a housing and the additional heat sink has cooling fins and is attached to the housing of the optoelectrical connector module or is integrally formed with at least one part of the housing of the optoelectrical connector module.

12. The optoelectrical connector module of claim 1, wherein the support structure has cooling fins on at least one surface thereof that is not connected to the flexible circuit board.

13. The optoelectrical connector module of claim 1, wherein the optoelectrical connector module further comprises a housing, which housing completely covers the flexible circuit board and the rigid support structure and comprises an orifice for receiving a corresponding counter connector, and wherein the PCB forms a wall of the housing.

14. The optoelectrical connector module of claim 1, wherein the flexible circuit board has at least a third region, and
   the rigid support structure has at least a third surface, and
   wherein the third surface is connected to the flexible circuit board opposite to the third region of the flexible circuit board.

15. The optoelectrical connector module of claim 1, wherein the flexible circuit board has thickness less than 1 mm.

16. The optoelectrical connector of claim 2, wherein the angle is between 10° and 40°.

17. The optoelectrical connector of claim 9, wherein the optical counter connector is a mechanical transfer ferrule (MT-ferrule) connector.

18. The optoelectrical connector of claim 15, wherein the flexible circuit board has a thickness less than 0.2 mm.

19. The optoelectrical connector of claim 8, wherein the angle is between 8° and 60°.

20. The optoelectrical connector of claim 8, wherein the flexible circuit board has a thickness less than 1 mm.

21. The optoelectrical connector of claim 8, wherein the at least one sensor comprises a temperature sensor.

22. The optoelectrical connector of claim 8, wherein the flexible circuit board has a bending radius that is less than 1.5 mm.

23. The optoelectrical connector of claim 8, wherein the optical module comprises a photoelectric device that transforms electrical signals to light signals and/or transforms light signals into electrical signals.

* * * * *

UNITED STATES PATENT AND TRADEMARK OFFICE
CERTIFICATE OF CORRECTION

PATENT NO. : 10,025,049 B2
APPLICATION NO. : 15/328472
DATED : July 17, 2018
INVENTOR(S) : Alexander Eichler-Neumann et al.

Page 1 of 1

It is certified that error appears in the above-identified patent and that said Letters Patent is hereby corrected as shown below:

In the Claims

At Column 7, Claim 8, Line 19:
-- An optoelectrical connector module of claim 1, com- --
Should read:
-- An optoelectrical connector module com- --

Signed and Sealed this
Thirteenth Day of November, 2018

Andrei Iancu
*Director of the United States Patent and Trademark Office*